US007093216B2

(12) United States Patent  (10) Patent No.: US 7,093,216 B2
Nozuyama  (45) Date of Patent: Aug. 15, 2006

(54) APPARATUS CONNECTABLE TO A COMPUTER NETWORK FOR CIRCUIT DESIGN VERIFICATION, COMPUTER IMPLEMENTED METHOD FOR CIRCUIT DESIGN VERIFICATION, AND COMPUTER PROGRAM PRODUCT FOR CONTROLLING A COMPUTER SYSTEM SO AS TO VERIFY CIRCUIT DESIGNS

(75) Inventor: Yasuyuki Nozuyama, Tokyo (JP)

(73) Assignee: Kabushiki Kaisha Toshiba, (JP)

( * ) Notice: Subject to any disclaimer, the term of this patent is extended or adjusted under 35 U.S.C. 154(b) by 329 days.

(21) Appl. No.: 10/773,702

(22) Filed: Feb. 6, 2004

(65) Prior Publication Data

US 2004/0230928 A1  Nov. 18, 2004

(30) Foreign Application Priority Data

Feb. 6, 2003 (JP) ............................ P2003-029696

(51) Int. Cl.
  *G06F 17/50* (2006.01)
  *G06F 9/45* (2006.01)
(52) U.S. Cl. ................................ 716/4; 716/5; 703/13
(58) Field of Classification Search ...................... None
  See application file for complete search history.

(56) References Cited

U.S. PATENT DOCUMENTS 4,862,399 A * 8/1989 Freeman ..................... 714/738
5,657,240 A * 8/1997 Chakradhar et al. ........... 716/4
6,108,494 A * 8/2000 Eisenhofer et al. ........... 703/14
6,192,505 B1 * 2/2001 Beer et al. ..................... 716/2
6,237,132 B1 * 5/2001 Dean et al. ................... 716/18
2002/0038203 A1 * 3/2002 Tsuchiya ....................... 703/15
2003/0149945 A1 * 8/2003 Abadir et al. .................. 716/3

FOREIGN PATENT DOCUMENTS

JP      01066578 A  * 3/1989
JP   P2001-273160    5/2001

* cited by examiner

*Primary Examiner*—Leigh M. Garbowski
(74) *Attorney, Agent, or Firm*—DLA Piper Rudnick Gray Cary US LLP

(57) ABSTRACT

An apparatus for circuit design verification according to an embodiment of the present invention has a verification result collector configured to collect a verification result, a data conversion and registration module configured to convert the verification result to a pre-analysis indication file, an analysis information collector configured to collect analysis information about a redundant non-active portion, an analysis information processor configured to exclude an affect of the redundant non-active portion and make an analysis indication file, an indication file storage portion configured to store the analysis indication file, and a data indication controller configured to output the analysis indication file.

18 Claims, 16 Drawing Sheets

| SERIAL NUMBER | LINE NUMBER | CORRESPONDING RTL DESCRIPTION | ANALYSIS RESULT ||||||
|---|---|---|---|---|---|---|---|---|
| | | | EXCLUDED BECAUSE OF UNUSED FUNCTION | EXCLUDED BECAUSE OF REDUNDANT DUE TO SPECIFIC TOOL | EXCLUDED BECAUSE OF INTENTIONAL REDUNDANT FOR EASY READING | UN-EXCLUDED BECAUSE OF INSUFFICIENT VERIFICATION PATTERN | UN-EXCLUDED BECAUSE OF INSUFFICIENT ANALYSIS | DETAILED COMMENT |
| 1 | 418 | | V | | | | | |
| 2 | 721 | | | V | | | | DEFAULT DESCRIPTION CORRESPONDING TO SYNOPYS DC |
| 3 | 1083 | | | | | | V | |
| 4 | 1156 | | | | V | | | |
| N | 2023 | | | | | V | | |

↑ X PORTIONS  ↑ y PORTIONS  ↑ z PORTIONS  ↑ w PORTIONS

FIG. 1

| MODULE | STATE COVERAGE | BRANCH COVERAGE | ... | TOGGLE COVERAGE |
|---|---|---|---|---|
| TOTAL | 95.7%<br>1231/1286 (55) | | | |
| ⋮ | | | | |
| Abcd | 94.9%<br>148/156 (8) | | | |
| ⋮ | | | | |

FIG. 4

| PRODUCT NAME | REGISTRATION DATES |
|---|---|
| aaaaa | 1999/09/24 |
| bbbbb | 1999/09/28 |
| • | |
| • | |
| • | |

FIG. 5

QUALITY RANK : A (2001.12.19)
   RTL CODE COVERAGE TOOL VERSION : 6.000
   RTL SIMULATOR : Verilog-XLx.x
   RELATED INFORMATION

FIG. 6

PRODUCT NAME : aaaaa
   VERSION :
   CONTAINING IP NAME,
   PRESENCE OF UNVERIFIED FUNCTION, RANK :
   TEST PATTERN
      TYPE : TSTL2
      VERSION :
   DEPARTMENT :
   PERSON IN CHARGE :
   CONTACT ADDRESS :

FIG. 7

| MODULE | STATE COVERAGE | | BRANCH COVERAGE | | ... | TOGGLE COVERAGE | |
| --- | --- | --- | --- | --- | --- | --- | --- |
| | PRE-ANALYSIS RESULT | ANALYSIS RESULT | PRE-ANALYSIS RESULT | ANALYSIS RESULT | | PRE-ANALYSIS RESULT | ANALYSIS RESULT |
| TOTAL | 95.7% 1231/1286 (55) | 97.5% 1254/1286 (10+8+5/55) | | | | | |
| ... | | | | | | | |
| Abcd | 94.9% 148/156 (8) | 98.0% 153/156 (2+2+1/8) | | | | | |
| .. | | | | | | | |

FIG. 8

| SERIAL NUMBER | LINE NUMBER | CORRESPONDING RTL DESCRIPTION | ANALYSIS RESULT | | | | | DETAILED COMMENT |
|---|---|---|---|---|---|---|---|---|
| | | | EXCLUDED BECAUSE OF UNUSED FUNCTION | EXCLUDED BECAUSE OF REDUNDANT DUE TO SPECIFIC TOOL | EXCLUDED BECAUSE OF INTENTIONAL REDUNDANT FOR EASY READING | UN-EXCLUDED BECAUSE OF INSUFFICIENT VERIFICATION PATTERN | UN-EXCLUDED BECAUSE OF INSUFFICIENT ANALYSIS | |
| 1 | 418 | | v | | | | | |
| 2 | 721 | | | v | | | | DEFAULT DESCRIPTION CORRESPONDING TO SYNOPYS DC |
| 3 | 1083 | | | | | | v | |
| 4 | 1156 | | | | v | | | |
| | | | | | | | | |
| N | 2023 | | | | | v | | |
| | | | ↑ | ↑ | ↑ | ↑ | | |
| | | | X PORTIONS | y PORTIONS | z PORTIONS | w PORTIONS | | |

FIG. 11

| MODULE | STATE COVERAGE | | BRANCH COVERAGE | | ... | FAULT COVERAGE | |
|---|---|---|---|---|---|---|---|
| | PRE-ANALYSIS RESULT | ANALYSIS RESULT | PRE-ANALYSIS RESULT | ANALYSIS RESULT | | PRE-ANALYSIS RESULT | ANALYSIS RESULT |
| TOTAL | 95.7%<br>1231/1286<br>(55) | 97.5%<br>1254/1286<br>(10+8+5/55) | | | | | |
| ... | | | | | | | |
| Abcd | 94.9%<br>148/156<br>(8) | 98.0%<br>153/156<br>(2+3/8) | | | | 93.2%<br>2983/3201<br>(218) | 95.2%<br>3047/3201<br>(39+25/218) |
| .. | | | | | | | |

FIG. 12

| SERIAL NUMBER | FAULT LIST | NODE | ANALYSIS RESULT | | | |
|---|---|---|---|---|---|---|
| | | | EXCLUDED BECAUSE OF UNUSED FUNCTION | EXCLUDED BECAUSE OF OTHER REASONS | UN-EXCLUDED | DETAILED COMMENT |
| 1 | sa0 | Abcd/xyyz[1] | v | | | |
| 2 | sa1 | Abcd/awg | | v | | REDUNDANT FAULT |
| 3 | sa1 | Abcd/wggza | | | v | INSUFFICIENT VERIFICATION PATTERN |
| | | | ← X PORTIONS | ← y PORTIONS | | |
| N | sa0 | Abcd/zxz | v | | | XXXX FUNCTION IS UNUSED |

| SERIAL NUMBER | FAULT LIST | NODE | WEIGHT | ANALYSIS RESULT | | | |
|---|---|---|---|---|---|---|---|
| | | | | EXCLUDED BECAUSE OF UNUSED FUNCTION | EXCLUDED BECAUSE OF OTHER REASONS | UN-EXCLUDED | DETAILED COMMENT |
| 1 | sa0 | Abcd/xyyz[1] | 237 | v | | | |
| 2 | sa1 | Abcd/awg | 201 | | v | | REDUNDANT FAULT |
| 3 | sa1 | Abcd/wggza | 127 | | | v | INSUFFICIENT VERIFICATION PATTERN |
| N | sa0 | Abcd/xz | 20 | v | | | XXXX FUNCTION IS UNUSED |

← X PORTIONS   ← y PORTIONS

APPARATUS CONNECTABLE TO A COMPUTER NETWORK FOR CIRCUIT DESIGN VERIFICATION, COMPUTER IMPLEMENTED METHOD FOR CIRCUIT DESIGN VERIFICATION, AND COMPUTER PROGRAM PRODUCT FOR CONTROLLING A COMPUTER SYSTEM SO AS TO VERIFY CIRCUIT DESIGNS

CROSS REFERENCE TO RELATED APPLICATIONS

This application is based upon and claims the benefit of priority from prior Japanese Patent Application P2003-029696 filed on Feb. 6, 2003; the entire contents of which are incorporated by reference herein.

BACKGROUND OF THE INVENTION

1. Field of the Invention

The present invention relates to an apparatus and a computer implemented method for circuit design verification and a computer product program for controlling a computer system so as to verify circuit designs and in particular to a functional simulation technology of a large scale integrated circuit (LSI) so as to obtain invaluable analysis results of RTL coverage.

2. Description of the Related Art

Along with rapid progress in larger scales and complexity of circuits such as LSIs in recent years, there is a growing movement to divert previously created design assets at designing the stage for new circuits. When designing a circuit by diverting the design assets, information on verification quality of a diverted circuit design is very important. For the information on verification quality, register transfer level (RTL) code coverage information and functional coverage information are, in general, widely used. The "RTL code coverage information" is information about which description is executed out of an entire circuit descriptions stated in the RTL when functional simulation is executed. A designer can recognize how many circuit descriptions executed in the functional simulation by a numerical value, such as a percentage, by referring to the RTL code coverage information and thereby obtain an indication for measuring the verification quality. The RTL code coverage includes state coverage, branch coverage, and toggle coverage as described later. In addition, the RTL code coverage may sometimes include condition coverage, state coverage and arc coverage. The condition coverage highlights problems with control variable values, control logic operators and helps to identify untested or redundant branching operations. The state coverage identifies untested or dead states and the arc coverage indicates the degree of execution of possible transitions among states in FSMs (Finite State Machines).

In conventional design verification systems used for analyzing the RTL code coverage, there has been some attempt to improve the analysis. For example, detailed results for individual functional blocks inside the circuit are displayed in graphs, the identifiers of the functional blocks are displayed in order of low-coverage, and the functional blocks that fail to complete requirements are displayed in a color, such as red. However, in any case, the conventional design verification systems are generally configured to directly display calculation results obtained by the functional simulation.

With reference now to FIG. 1, an example of the contents of a display in the conventional design verification system is illustrated. FIG. 1 represents results of verifying the degree of achievement in the RTL code coverage of the LSI and functional blocks inside the LSI expressed in the register transfer level (RTL) descriptions by executing the functional simulation with test patterns or verification patterns. As shown in FIG. 1, a column of "state coverage" for indicating a rate of execution of respective statements or rows in the executable RTL descriptions, a column of "branch coverage" for indicating a rate of execution of true and false responses concerning executable branch sentences, and a column of "toggle coverage" for indicating a rate of 1 and 0 values applied by connection wiring of the RTL descriptions are displayed. A row "total" for indicating results of an entire module (the functional blocks inside the target LSI), and a row "Abcd" for indicating results of some sub-modules constituting the entire module are also displayed. The value (95.7%) in the upper part of the "total" and the "state coverage" section in FIG. 1 indicates a value of the state coverage of the target LSI. The value of the denominator (1286) in the fraction indicates the total number of statements in the RTL descriptions for the functional blocks of the target LSI, the value of the numerator (1231) indicates the number of statements activated by the test pattern, and the value in parenthesis (55) indicates the number of statement not activated by the test pattern.

As shown in the example of FIG. 1, when the design verification is executed with a newly developed LSI, it is usually rare for the state coverage, the branch coverage or the like to reach 100% in the first simulation. Therefore, the designer has to verify the non-active portions one-by-one, and execute the functional simulation again by adding new test patterns when the verification is insufficient. Such additional verifications are executed until predetermined standards are satisfies, then the results of the verification are registered with the design verification system for use in confirmation of the verification or for reference by a third party.

However, in reality, there are many cases where the predetermined coverage standards are not achieved by the repeated simulation with new test patterns. The main reasons areas follows. First, a mixture of redundant RTL descriptions is present. For example, a mixture of specific redundant descriptions attributable to a request from a logic synthesis tool or redundant descriptions attributable to specifications of the logic synthesis tool is present. Second, redundant RTL descriptions due to reasons specific to a product under development are present. For example, redundant descriptions in anticipation of future necessities, adoption of redundant descriptions in light of future expansions that are not used in the production under development are present, or there are reuses of some functional blocks from another product including descriptions concerning functions which are not used in the product under development. Further, there are occasional provisions of redundant flip-flops (flip-flops which are only set to 0 and 1) by an RTL designer for easy reading of the RTL descriptions.

Of course, there is also a case where the quality of the produced functional verification pattern is insufficient and some RTL code that is supposed to be activated or verified remains non-active, which is especially typical in the product under development. Therefore, to obtain precise information of the RTL code coverage for the product under development, "redundant non-active or unverified portion" (hereinafter called "the redundant non-active portion") which does not affect the product under development should be excluded by analyzing the result of the functional simulation for the circuit. Therefore, there has been a large problem that the invaluable verification result could not be obtained by only registering and displaying the results obtained by the functional simulation directly.

SUMMARY OF THE INVENTION

An aspect of present invention inheres in an apparatus connectable to a computer network for circuit design verification according to an embodiment of the present invention having a verification result collector configured to collect a verification result of a circuit, a data conversion and registration module configured to convert the verification result to a pre-analysis indication file, an analysis information collector configured to collect analysis information about a redundant non-active portion of the circuit, an analysis information processor configured to exclude an affect of the redundant non-active portion from the verification result and make a analysis indication file, a indication file storage portion configured to store the pre-analysis indication file and the analysis indication file, and a data indication controller configured to output the pre-analysis indication file and the analysis indication file.

Another aspect of the present invention inheres in a computer implemented method for design verification according to the embodiment of the present invention including collecting a verification result of a circuit through a computer network, converting the verification result to a pre-analysis indication file and storing the pre-analysis indication file in an indication file storage portion, collecting analysis information about a redundant non-active portion of the circuit through the computer network, excluding an affect of the redundant non-active portion from the verification result and making an analysis indication file, and storing the analysis indication file in the indication file storage portion.

Yet another aspect of the present invention inheres in a computer program product for controlling a computer system so as to verify circuit designs according to the embodiment of the present invention, the computer program product including instructions configured to collect a verification result of a circuit through a computer network, instructions configured to collect analysis information about a redundant non-active portion of the circuit through the computer network, instructions configured to exclude an affect of the redundant non-active portion from the verification result and making an analysis indication file within the computer system, and instructions configured to store the analysis indication file in the indication file storage portion within the computer system. Yet another aspect of the present invention inheres in a computer implemented method for manufacturing an integrated circuit according to the embodiment of the present invention including sending a verification result of a circuit design to an apparatus for circuit design verification through a computer network, instructing the apparatus to convert the verification result to a pre-analysis indication file and store the pre-analysis indication file in an indication file storage portion, sending analysis information about a redundant non-active portion of the circuit design to the apparatus through the computer network, instructing the apparatus to exclude an affect of the redundant non-active portion from the verification result and make an analysis indication file, instructing the apparatus to store the analysis indication file in the indication file storage portion, receiving the analysis indication file from the apparatus, and fabricating the integrated circuit using the analysis indication file.

Yet another aspect of the present invention inheres in an integrated circuit according to the embodiment of the present invention, fabricated using method comprising sending a verification result of a circuit design to an apparatus for circuit design verification through a computer network, instructing the apparatus to convert the verification result to a pre-analysis indication file and store the pre-analysis indication file in an indication file storage portion, sending analysis information about a redundant non-active portion of the circuit design to the apparatus through the computer network, instructing the apparatus to exclude an affect of the redundant non-active portion from the verification result and make an analysis indication file, instructing the apparatus to store the analysis indication file in the indication file storage portion, receiving the analysis indication file from the apparatus, and fabricating the integrated circuit using the analysis indication file.

BRIEF DESCRIPTION OF DRAWINGS

FIG. 1 is an example of an illustration of a computer display showing a result of a functional simulation;

FIG. 4 is the example of the illustration of the computer display showing analysis results with the embodiment of the present invention;

FIG. 5 is another example of the illustration of the computer display showing analysis results with the embodiment of the present invention;

FIG. 6 is yet another example of the illustration of the computer display showing analysis results with the embodiment of the present invention;

FIG. 7 is yet another example of the illustration of the computer display showing analysis results with the embodiment of the present invention;

FIG. 8 is yet another example of the illustration of the computer display showing analysis results with the embodiment of the present invention;

FIG. 11 is the example of the illustration of the computer display showing analysis results with the first modification of the embodiment of the present invention;

FIG. 12 is another example of the illustration of the computer display showing analysis results with the first modification of the embodiment of the present invention;

DETAILED DESCRIPTION OF THE INVENTION

Figure 2:
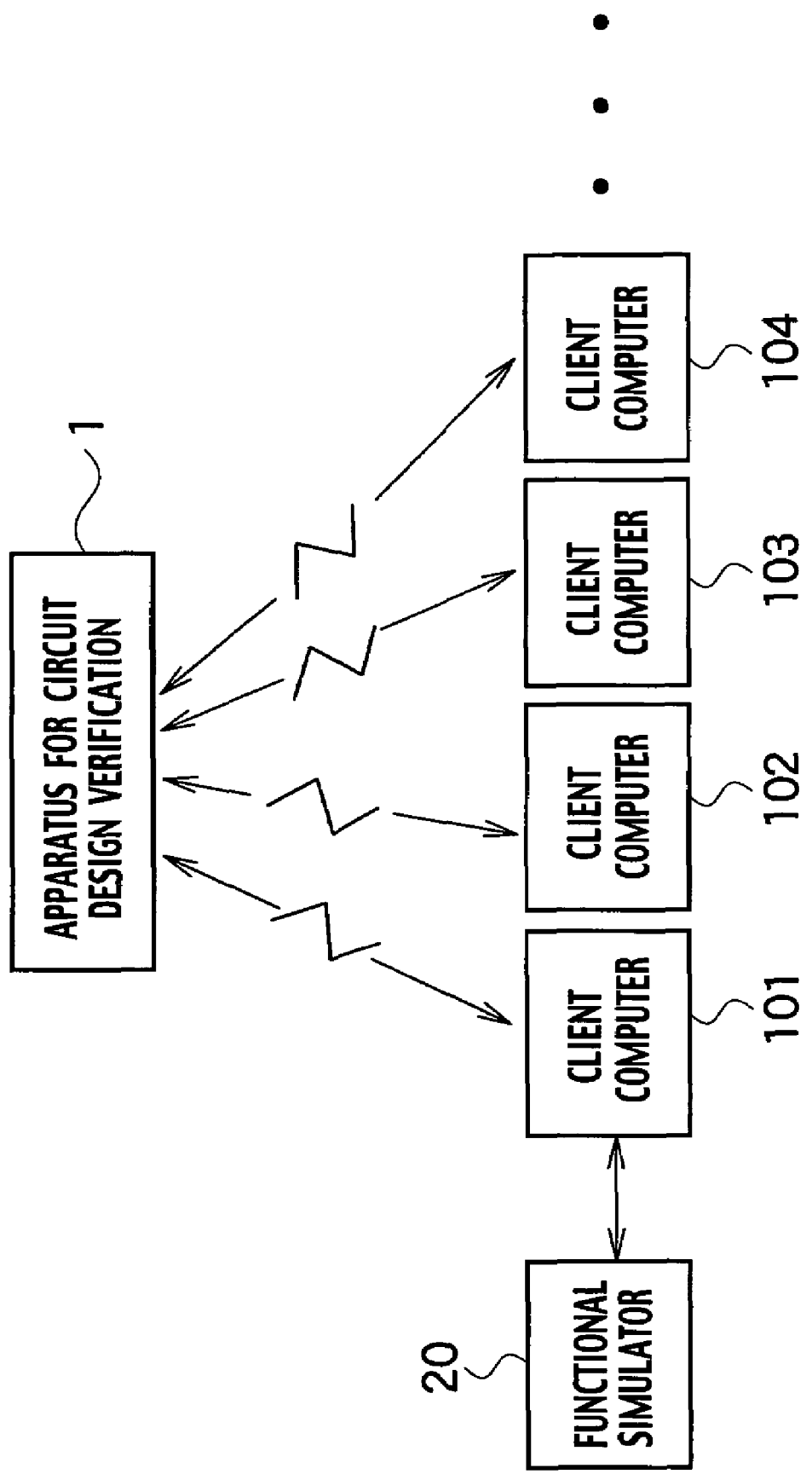
FIG. 2 illustrates a computer network and an apparatus for circuit design verification in accordance with an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

With reference now to FIG. 2, an apparatus for circuit design verification 1 according to an embodiment of the present invention is connected to a plurality of client computer 101, 102, 103, 104, . . . via a computer network. Each of computers 101–104 is a personal computer (PC) or an engineering workstation (EWS). It should be noted that the term "computer network" includes Internet and local area networks (LAN).

The client computer 101 is connected to a functional simulator 20 configured to execute a functional simulation. The client computer 101 may also execute the functional simulation. The client computer 101 stores the result data in a secondary storage device managed by the client computer 101.

Figure 3:
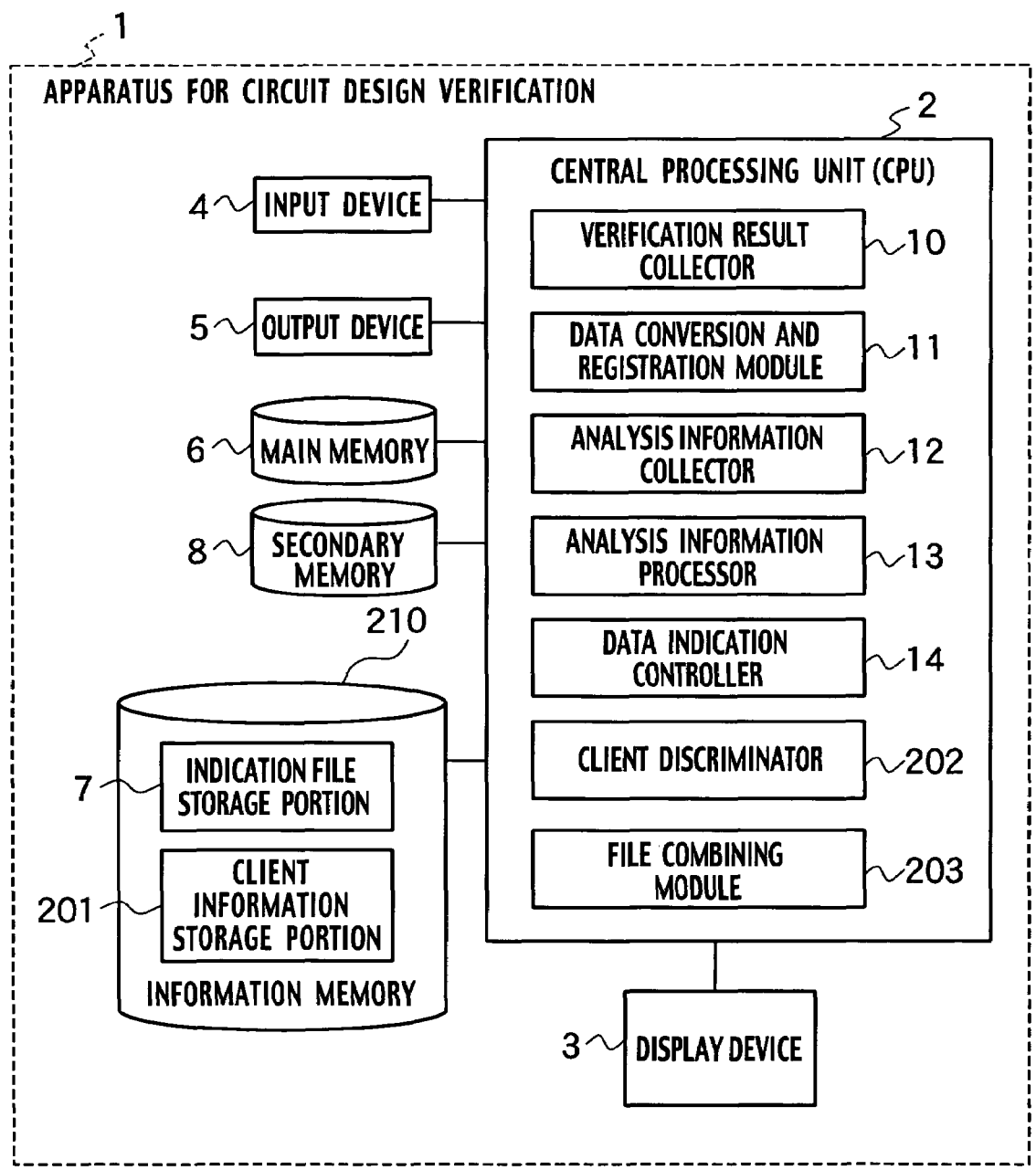
FIG. 3 is a block diagram of an apparatus connectable to the computer network for circuit design verification in accordance with the embodiment of the present invention.

With reference next to FIG. 3, the apparatus for circuit design verification 1 includes a central processing unit (CPU) 2, a display device 3, an input device 4, an output device 5, a main memory 6, an information memory 210, and a secondary memory 8.

The CPU 2 includes a verification result collector 10, a data conversion and registration module 11, an analysis information collector 12, an analysis information processor 13, a data indication controller 14, a file combining module 203, and a client discriminator 202. The information memory 210 includes an indication file storage portion 7 and a client information storage portion 201.

The input device 4 includes a connection device for connection to a computer network shown in FIG. 2, a keyboard, a mouse, a voice device, a reader device for a "recording medium" such as a CD-ROM or a magnetic tape, and the like. When an input operation is carried out with the input device 4 shown in FIG. 3, corresponding information is transmitted to the CPU 2.

The verification result collector 10 collects a verification result such as RTL code coverage of a circuit obtained by the functional simulation from the input device 4 in response to a registration request from the client computer 101 shown in FIG. 2.

The data conversion and registration module 11 shown in FIG. 3 performs editing which is necessary for displaying the verification result, obtained by the verification result collector 10, on the display device 3, and makes a pre-analysis indication file.

The analysis information collector 12 collects the analysis information from the input device 4 in response to an analysis information input request from the client computers 101–104 shown in FIG. 2. It should be noted that the "analysis information" is information on a redundant non-active portion of the circuit that does not affect the product under development because the redundant RTL descriptions due to reasons specific to the product is present for example.

The analysis information processor 13 updates verification result such as the RTL code coverage by excluding the affect of the redundant non-active portion that does not affect the circuit under development, based on the analysis information obtained by the analysis information collector 12. The analysis information processor 13 performs editing which is necessary for displaying the analysis result of the verification result data on the display device 3, and makes an analysis indication file. Moreover, since the data conversion and registration module 11 and the analysis information processor 13 have processing contents which are similar to each other, it is also possible to combine both units into one unit as a data processing unit configured to execute the data conversion, registration, and analysis information processing, particularly when the indication files in the same format are used before and after the analysis.

The file combining module 203 combines the pre-analysis indication file made by the data conversion and registration module 11 and the analysis indication file made by the analysis information processor 13 to make a combined analysis indication file.

The indication file storage portion 7 stores the verification result obtained by the verification result collector 10, the analysis information obtained by the analysis information collector 12, the pre-analysis indication file made by the data conversion and registration module 11, the analysis indication file made by the analysis information processor 13, and the combined analysis indication file made by the file combining module 203.

The data indication controller 14 instructs the display device 3 and display devices such as monitors connected to the client computers 101–104 shown in FIG. 2, to show the content of the pre-analysis indication file, the analysis indication file, or the combined analysis indication file stored in the indication file storage portion 7.

The client information storage portion 201 stores a client information about the client computers 101–104 shown in FIG. 2. The client information is whether each of the client computers 101–104 has authority to only read the contents of the indication file storage unit 7 or authority to read and write the contents of the indication file storage unit 7.

The client discriminator 202 determines whether each of the client computers 101–104 is permitted to access the indication file storage unit 7, based on the client information stored in the client information storage portion 201.

The output device 5 includes a printer, and a connection device for connection to the computer network.

The main memory 6 is a device for storing various data such as input data and program data, and incorporates a ROM and a RAM. The main memory 6 saves temporary data during program execution processing by the CPU 2 and is used as a work area. The design verification program may be stored in the RAM for execution.

The secondary memory 8 is configured to store programs such as the design verification program inputted from the input device 4, data, and the like, and to store a processing result of the program.

A CRT, a liquid crystal display (LCD) device, a light emitting diode (LED) panel, and an electroluminescence (EL) panel are available for the display device 3.

Next, concrete display examples on the display device 3 in FIG. 3 and display devices of the client computers 101–104 in FIG. 2 is described with reference to FIG. 4 to FIG. 8. First of all, buttons for selecting either registration or review are shown on a top page on the display device. When review is selected, registered "product names" are shown together with "registration dates" as shown in FIG. 4.

When a product "aaaaa" is selected in FIG. 4, for example, a quality rank of the product "aaaaa", version information of an RTL code coverage evaluation tool, a name of a functional simulator (an RTL simulator), a "related information" button, and the like are displayed as shown in FIG. 5.

When the "related information" is selected in FIG. 5, the product name, version information of the product, registrant information, a "test pattern" button (version information is sometimes described), and the like are displayed as shown in FIG. 6. Thereafter, when the "test pattern" is selected in FIG. 6, a list (not shown) containing a test pattern name and detailed contents of verification is displayed. When the product "aaaaa" is selected in FIG. 4, together with FIG. 5 (on the same page as FIG. 5) simulation results such as the RTL code coverage or test coverage, and the analysis results thereof, such as analysis information input results after excluding redundant non-active portions, are displayed adjacently as shown in FIG. 7.

On a lower part of an "analysis result" column in FIG. 7, the formula (x+y+z/N) such as (10+8+5/55) in "total" line and (2+2+1/8) in "Abcd" line is indicated. The code "N" denotes the total number of the non-active portions obtained from the verification result before the analysis. The code "x" denotes the number of the redundant non-active portions that are not used in the product and excluded from the total number of the non-active portions. The code "y" denotes the number of default sentences corresponding to logic synthesis and redundant RTL descriptions (RTL codes) due to a specific reason for the product. The code "z" denotes the number of redundant RTL descriptions (RTL codes) intentionally provided by the designer for easy reading of the RTL description. Therefore, the user reviewing the display as shown in FIG. 7 can easily understand the positions to be carefully checked for any purpose.

In this case, the code "x" is especially important. Accordingly, only the code "x" may be displayed in a different color from other data to call the attention of the reviewer. Moreover, it is also possible to understand the degree of execution of the analysis by checking the data. That is, it is possible to understand that (x+y+z) pieces out of the total N pieces have completed the analysis and the analysis information processor 13 shown in FIG. 3 excludes the (x+y+z) pieces of non-active portions from the total non-active portions since the (x+y+z) pieces of non-active portions do not affect the product using the circuit. Further, it is possible to understand that (N−(x+y+z)) pieces, at the maximum, remain as the portions yet to be analyzed or as the portions which have been analyzed and in an undetermined state as to why the portions are non-active. However, to be more precise, the (N−(x+y+z)) pieces may include those judged to be irremovable because of a lack of test patterns or verification patterns. Accordingly, when a formula is expressed as "(x+y+z, w)" on the assumption that "w" is the number of the pieces judged as the non-active due to the lack of the test patterns or the verification patterns as the result of the analysis, N−(x+y+z+w) is equal to a sum of the number of the non-active portions which remain undetermined state as to why the portions are non-activated.

In addition, when "(x+y+z, w/N)" is selected by a user in FIG. 7, it is possible to confirm the analysis result as shown in FIG. 8 (in the case of the drawing, the display "(x+y+z/N)" in FIG. 7 may be replaced by "x+y+z, w)" instead) On each item, columns are provided for designating as to which one of a corresponding RTL description and the redundant non-active portions which are excluded, a column for designating an un-excluded non-active portion due to the lack of verification patterns, and a column for freely describing the detailed comments. In addition, there is also provided a column for designating a failure to categorize the item into any of the foregoing cases. However, instead of checking the column, it is often sufficient just by filling the free description. According to the display in FIG. 8, it is possible for the user to understand clearly the process to the final result in detail.

Figure 9:
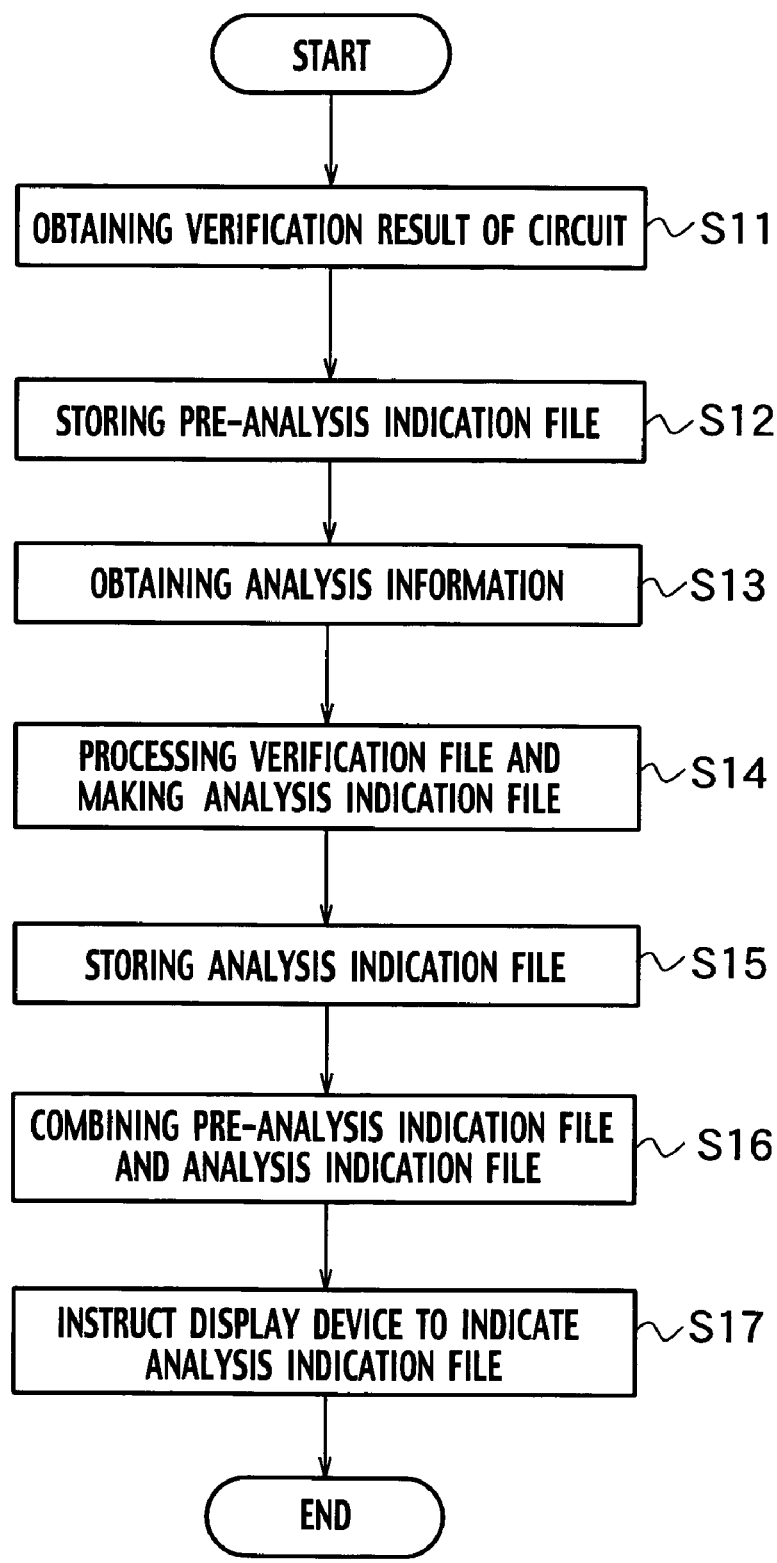
FIG. 9 is a flowchart depicting the operation of the embodiment of the present invention.

With reference next to FIG. 9, a computer implemented method for circuit design verification in accordance with the embodiment is described.

(a) In Step S11, the verification result collector 10 shown in FIG. 3 collects the verification result such as the RTL code coverage information from the input device 4 or the secondary memory 8 in response to the registration request from the client computer 101 shown in FIG. 1. In Step S12, the data conversion and registration module 11 shown in FIG. 3 performs editing processing for displaying the verification result obtained by the verification result collector 10 on the display device 3, and registers the editing result with the indication file storage portion 7 as the pre-analysis indication file.

(b) In Step S13, the analysis information collector 12 collects the analysis information inputted from the input device 4 in response to the analysis information input request from each of the client computers 101–104 shown in FIG. 1. Information on the redundant non-active portions which correspond to unused functions, information on the redundant non-active portions due to the reason specific to the currently designed product, and information on the redundant non-active portions due to the reason that the designer intentionally created a redundancy in order to give priority to clear appearance of the RTL descriptions are inputted individually. Further, in light of capability of confirming as to whether the analysis is surely executed or not, information on the non-active portions due to the lack of the test patterns or the verification patterns may also be inputted as the analysis information. As for an inputting method for the analysis information, it is possible to input files previously composed as concrete analysis information. Alternatively, it is also possible for each of the client computers 101–104 to review an indication file having blank spaces corresponding to the non- active portions to be analyzed before or after registration to the analysis information collector 12 and fill out the blank spaces by an input operation after analysis.

(c) In Step S14, the analysis information processor 13 shown in FIG. 3 excludes the affect of the redundant non-active portions which does not affect the product using the circuit from the verification result, based on the analysis information obtained by the analysis information collector 12. In Step S15, the analysis information processor 13 performs the editing processing which is necessary for displaying the analysis result of the verification result on the display device 3, and registers the editing result with the indication file storage portion 7 as the analysis indication file. Here, the display file may be of a final form (format) so that the data indication controller 14 uses the file directly, or of an intermediate form to allow addition of the analysis information appropriately on the basis of the simulation result data. In the latter case, the data indication controller 14 may convert the intermediate form into the final format.

(d) In Step S16, the file combining module 203 shown in FIG. 3 combines the pre-analysis indication file and the analysis indication file and makes the combined analysis indication file. Further, in Step S17 the data indication controller 14 instructs the display device 3 or the display devices connected to the client computers 101–104 to display the combined analysis indication file. Displaying the pre-analysis indication file obtained in step S12 and the analysis indication file obtained in step S15 individually is an alternative.

As described above, the apparatus for circuit design verification 1 shown in FIG. 3 and the computer implemented method for design verification makes it possible to store accumulated analysis data. Therefore, in the case where each of the client computers 101–104 shown in FIG. 2 is permitted to access the apparatus for circuit design verification 1 by an administrator of the apparatus, it is possible for each of the client computers 101–104 to request the apparatus for circuit design verification 1 to read data stored in the information memory 210 by entering the user name (ID) and a password. When the client discriminator 202 permits the request, it is possible for each of the client computers 101–104 to review and copy the files in the indication file storage portion 7 in accordance with the computer network protocol.

Further, in the case where each of the client computers 101–104 shown in FIG. 2 is permitted to write new data in the indication file storage portion 7, it is possible for each of the client computers 101–104 to enter new analysis information to the analysis information collector 12 and make a new analysis indication file by using the verification result stored in the indication file storage portion 7. The new analysis indication file is also stored in the indication file storage portion 7.

It is possible for each of the authorized client computers 101–104 to read the new analysis indication file. Therefore, a plural clients enter the verification result and analysis information of the circuit such as the RTL code coverage and read and verify the analysis indication file at the same time. Consequently, it is possible to improve verification efficiency and quality of the circuit at the same time.

FIRST MODIFICATION OF THE EMBODIMENT

The apparatus for circuit design verification 1 shown in FIG. 3 is used to analyze the RTL code coverage of the circuit in the embodiment. However, the apparatus for circuit design verification 1 is also available to analyze a fault detecting ratio of the circuit.

Figure 10:
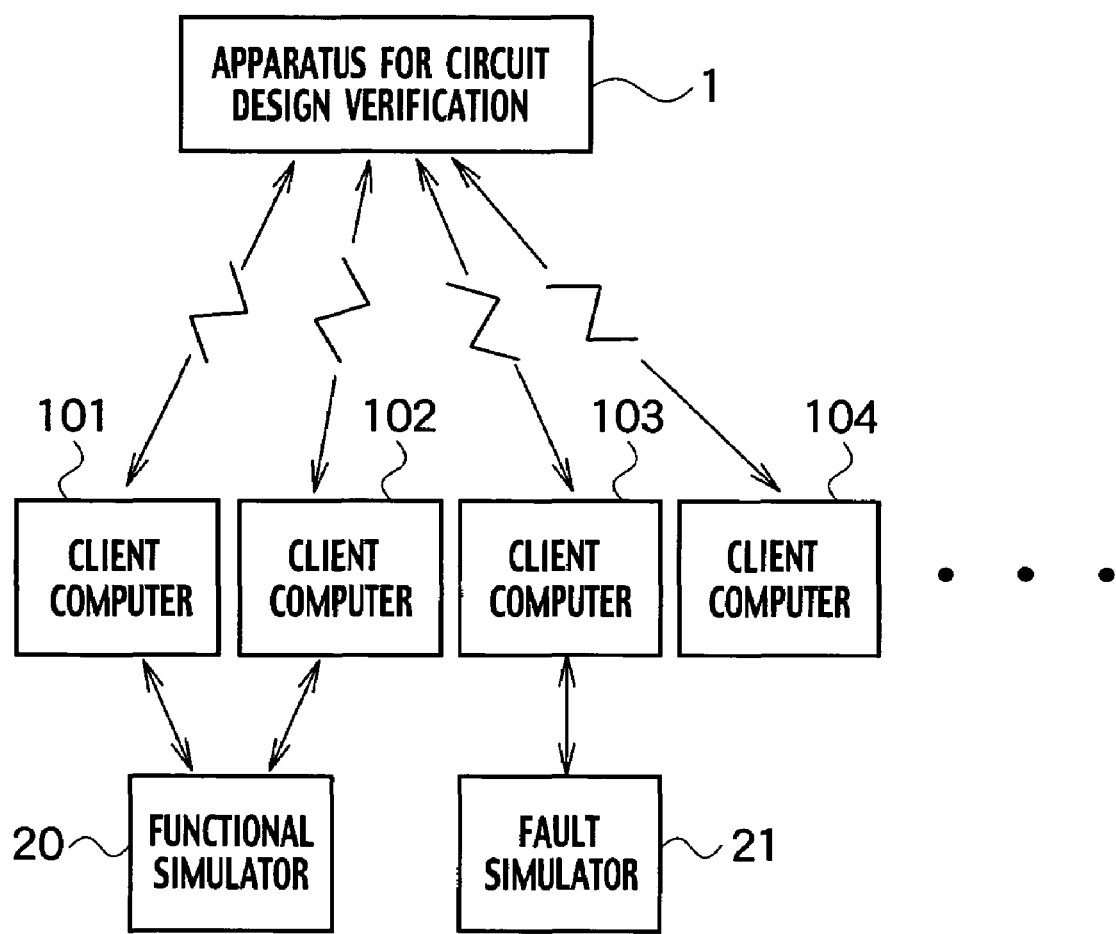
FIG. 10 is the block diagram of the apparatus connectable to the computer network for circuit design verification in accordance with a first modification of the embodiment of the present invention.

With reference to FIG. 10, the client computers 101 and 102 are connected to the functional simulator 20 to execute the functional simulation. In addition, the client computer 103 is connected to the fault simulator 21 to execute the fault simulation. When the functional simulator 20 and the fault simulator 21 take the form of software, the connections in the drawing represent conceptual connections as similar to the embodiment.

In this case, the data conversion and registration module 11 shown in FIG. 3 executes necessary data conversion to be displayed on a display device 3 in response to two types of the verification result, namely, the functional simulation result data such as the RTL code coverage obtained by the functional simulator 20 or dedicated software operating in the functional simulator 20, and fault simulation result data such as fault coverage obtained by the fault simulator 21, and registers the pre-analysis indication file with a indication file storage portion 7. The fault coverage is data obtained by the fault simulator 21, an automatic test pattern generation (ATPG) tool or the like. The data representing the degree of detection of stuck-at-0 faults and stuck-at-1 faults that occur in connection wiring nodes inside the LSI or input/output terminals of internal basic cells including input/output terminals of the LSI are often used in general.

With reference next to FIGS. 11 and 12, concrete display examples on the display devices of the client computers 101–104 shown in FIG. 10 are described. FIG. 11 is the display example showing the fault coverage in addition to the items displayed in FIG. 7 described in the embodiment. As shown in FIG. 11, the fault simulation result as the pre-analysis result and the analysis result thereof are displayed adjacently to each other. A formula "x+y/N" is displayed in a column for the analysis result of the fault coverage. The code "N" denotes the number of total undetected faults in a pre-analysis fault simulation result, and the code "x" denotes the number excluded from the total undetected faults due to a reason of being faults related only to functions not used in the product. The code "y" denotes the number excluded due to a reason of being logically redundant faults. As similar to the embodiment, the "x" is most important to the designer who reviews the results. Here, an inputting method for the analysis information is the same as the embodiment and description thereof is omitted herein.

In comparison with the display example shown in FIG. 8 described in the embodiment, FIG. 12 has a different column for the analysis result in response to the above-described formula "x+y/N". Further, the display example shown in FIG. 12 also displays the stuck-at-0 faults and the stuck-at-1 faults. A sub-column "un-excluded" in the column "analysis result" may be divided into two columns of "un-excluded due to lack of test patterns" and "un-excluded due to difficulty in analysis". In FIG. 12, the stuck-at-0 faults and the stuck-at-1 faults are shown as "sa0" and "sa1", respectively. Further, the display example shown in FIG. 12 also provides a column for indicating a node or a terminal containing a fault. Concerning registration of the fault simulation result data such as the fault coverage, the data are related to manufacturing environments for LSIs. Accordingly, it is possible to review abundant information by linking and thereby displaying the data with layout information and the latest manufacturing data, such as a manufacturing facility, name of a clean room, cleanliness of the clean room, dust ratio, or yields for each lot and wafer.

Figure 13:
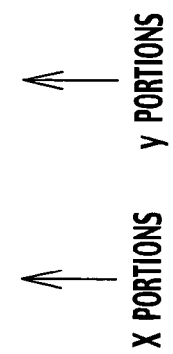
FIG. 13 is yet another example of the illustration of the computer display showing analysis results with the first modification of the embodiment of the present invention.

With reference next to FIG. 13, it is also possible to display the respective faults by adding appropriate layout elements such as wiring lengths or minimum contact numbers, or adding weights such as appropriately weighted sums thereof. In this case, it is possible to display the un-excluded faults in particular in descending order of the weights by entirety or by functional block. Therefore, a designer or a person in charge of producing test patterns makes it possible to conduct efficiently an analyzing operation or an operation for adding test patterns. Further, it is also possible to add a function to display the functional blocks in descending order of the weights thereof, for example.

According to the apparatus connectable to the computer network for circuit design verification according to the first modification of the embodiment, it is possible to register and review the fault coverage as the quality data in addition to the RTL code coverage information.

SECOND MODIFICATION OF THE EMBODIMENT

Figure 14:
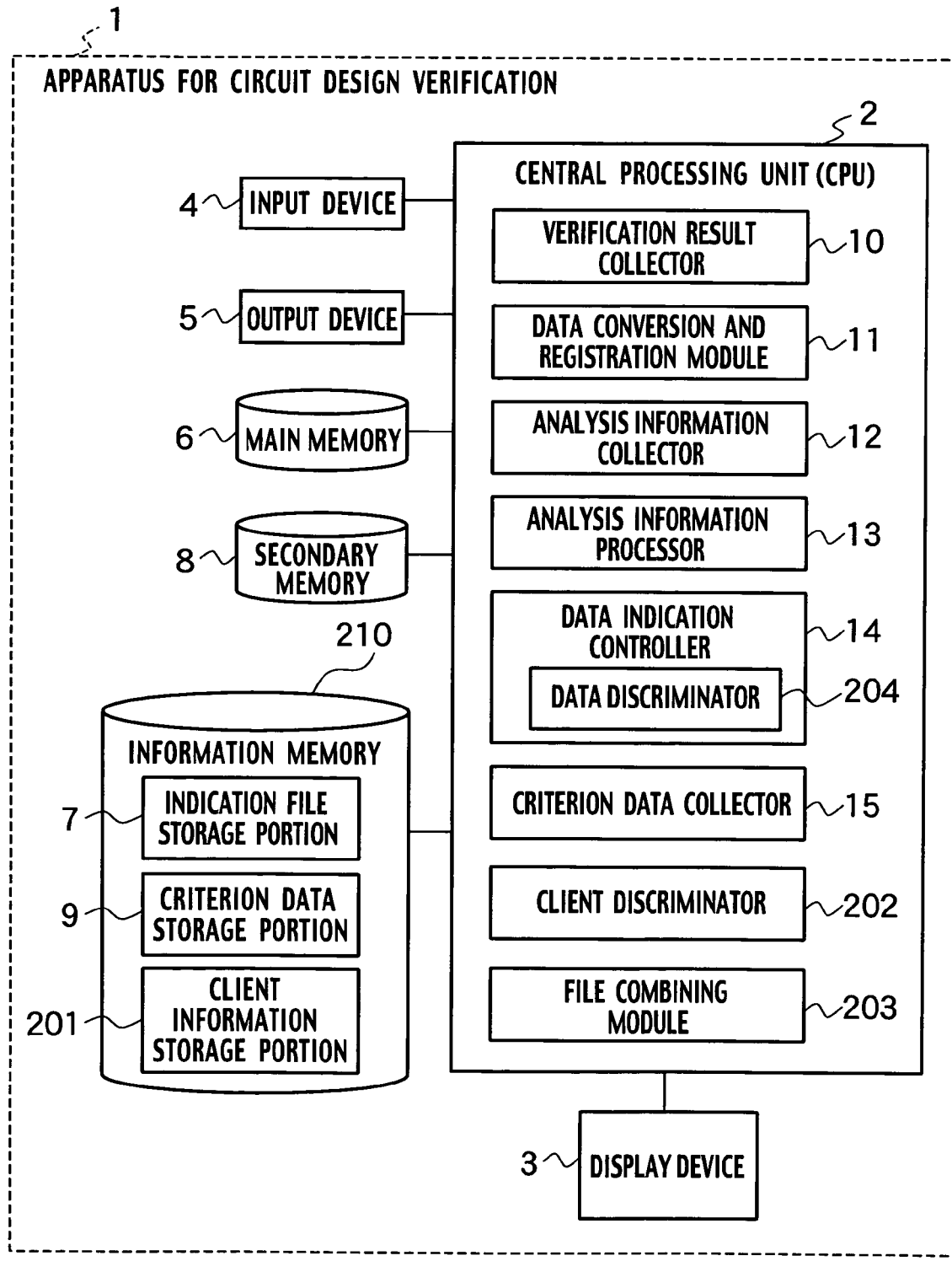
FIG. 14 is the block diagram of the apparatus connectable to the computer network for circuit design verification in accordance with a second modification of the embodiment of the present invention.

In comparison with the apparatus for circuit design verification 1 shown in FIG. 3, the apparatus for circuit design verification 1 according to a second modification of the embodiment shown in FIG. 14 further includes a criterion data storage portion 9 in the information memory 210, a criterion data collector 15 in CPU 2, and a data discriminator 204 in the data indication controller 14. Since other components are similar to the apparatus for circuit design verification 1 shown in FIG. 3, explanation of the other components is omitted.

The criterion data collector 15 shown in FIG. 14 collects quality standard information of the product using the circuit from the client computers 101–104 shown in FIG. 2. The "quality standard information" is criteria for the state coverage, the branch coverage, and the fault coverage that should be satisfied. The criterion data storage portion 9 stores the quality standard information collected by the criterion data collector 15.

The data discriminator 204 analyzes the analysis indication file stored in the indication file storage portion 7. If the analysis indication file contains the item that does not satisfy the quality standard, the data discriminator 204 instructs the data indication controller 14 to display the item in different color.

Next, operations of the apparatus for circuit design verification 1 are described. Firstly, an authorized user inputs the latest quality standards information to the apparatus for circuit design verification 1 through the client computers 101–104 connected to the computer network. The criterion data collector 15 collects the quality standard information and stores the quality standard information with the criterion data storage portion 9. Concerning a certain item, if the analysis result obtained by analyzing the verification result does not meet the quality standard registered with the criterion data storage portion 9, the data indication controller 14 instructs display devices of the client computers 101–104 to show the item distinctively from other items in a different character color, for example. A default quality standard is in accordance with the latest standard data that are registered with the criterion data storage portion 9. If a user wishes to see a display, based on the past standard data when reviewing the registered and analyzed data, the user can specify such a display mode out of the standard data registered with the criterion data storage portion 9.

According to the apparatus for circuit design verification 1 on the second modification of the embodiment, which includes the above-described apparatus for circuit design verification 1 and is configured by a network similar to the embodiment, a general user can evaluate the registered data depending on different standards.

THIRD MODIFICATION OF THE EMBODIMENT

The apparatus for circuit design verification 1 according to a third modification of the embodiment is premised on reuse of an LSI or a functional block inside the LSI. Even when the LSI or the functional block is not reused, there may be a case where part of the LSI or the functional block turns out to be insufficient as a result of evaluation of the RTL coverage information and revaluation of the RTL code coverage takes place by adding a test pattern afterwards. In this case, the number of the non-active portions or the portions yet to be analyzed in the LSI or the functional block inside the LSI are gradually decreased when the LSI or the functional block inside the LSI are reused for several times, or when the RTL code coverage evaluation and analysis are carried out at least once with the new test pattern. Consequently, the predetermined standards may be achieved.

Therefore, when the result of the RTL code coverage obtained with the functional simulation on the same LSI or the same functional block inside the LSI is updated by the same registrant, or when a plurality of results are registered by different registrants, the apparatus for circuit design verification 1 integrally display respective pieces of the functional simulation result data and the analysis processing results thereof.

Figure 15:
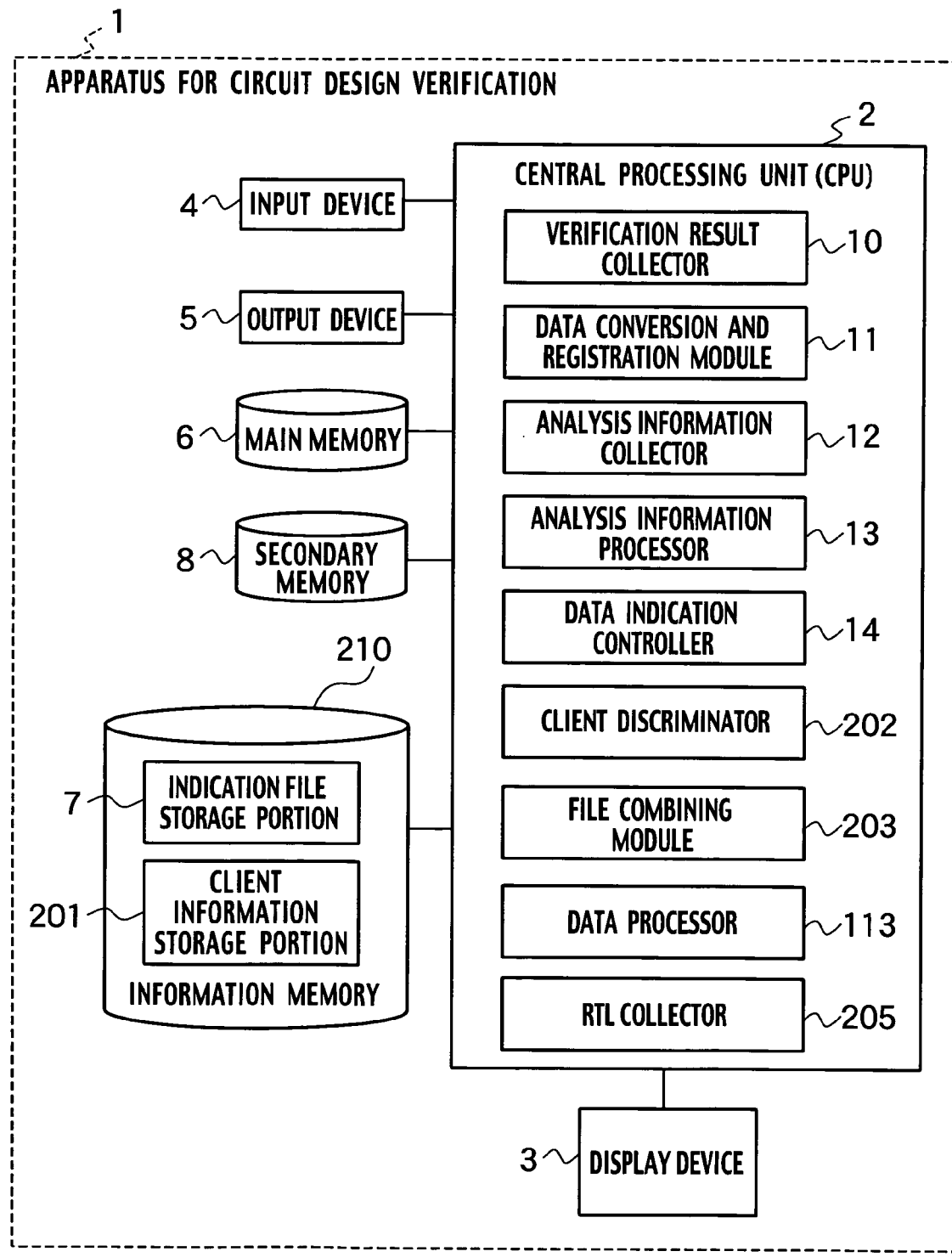
FIG. 15 is the block diagram of the apparatus connectable to the computer network for circuit design verification in accordance with a third modification of the embodiment of the present invention.

The apparatus for circuit design verification 1 shown if FIG. 15 further includes a data processor 113. The data processor 113 corresponds to the case when the verification result such as the RTL code coverage is updated.

The data processor 113 compares the analysis indication file stored in the indication file storage portion 7 and the pre-analysis indication file of the updated verification result entered through the input device 4. Thereafter, the data processor 113 extracts a common non-active portion as an "integrated indication file". It should be noted that the "updated verification data" is the verification data obtained by the functional simulation of the circuit with additional test patterns.

The data processor 113 extracts the portion where is non-active in the analysis indication file in the indication file storage portion 7 and is active in the updated verification result. When the data processor 113 makes the integrated indication file, the data processor 113 deletes former analysis result or changes the former analysis result to a reference file. The integrated indication file is stored in the indication file storage portion 7.

When the registration results of the same LSI and the same functional block inside the LSI are diverted, there is a possibility that the updated verification result shows more non-active portions. In this case, the registered analysis results concerning applicable items are preferably displayed as reference so that a person in charge of verification can judge whether or not the analysis processing results upon registration are acceptable. Even in the case of updating, if the pre-analysis indication file is registered with the indication file storage portion 7, then it is only necessary to overwrite and register the functional simulation results after addition of the test pattern.

Figure 16:
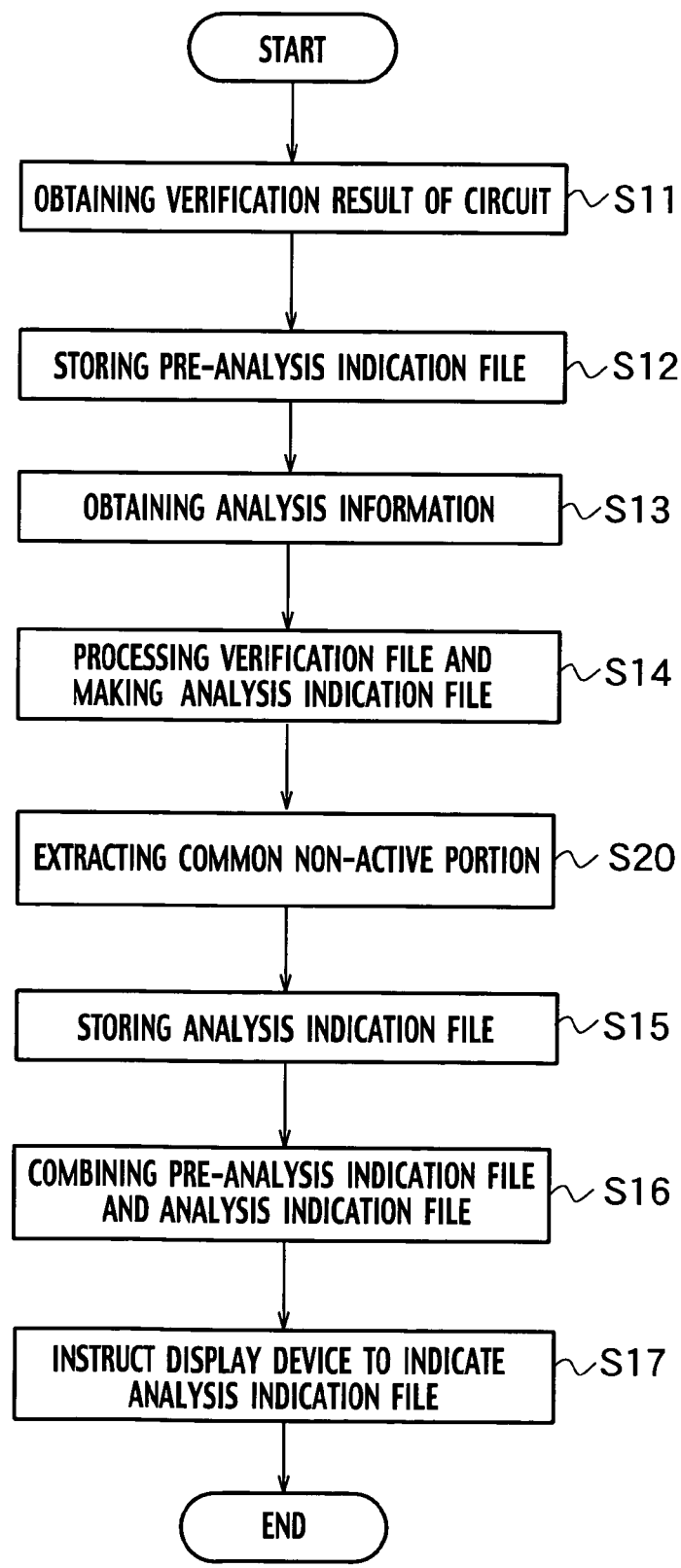
FIG. 16 is the flowchart depicting the operation of the third modification of the embodiment of the present invention.

With reference next to FIG. 16, a computer implemented method for circuit design verification in accordance with the third modification of the embodiment is described.

(a) In Step S11, the verification result collector 10 collects the updated verification result about the circuit of which analysis indication file is already stored in the indication file storage portion 7. In Step S12, the data conversion and registration module 11 performs editing processing for displaying the updated verification result on the display device 3, and registers the editing result with the indication file storage portion 7 as the updated pre-analysis indication file.

(b) In Step S13, the analysis information collector 12 collects the updated analysis information. However, in the case that the updated analysis information is not present, the analysis information stored in the indication file storage portion 7 is reused. In Step S14, the analysis information processor 13 excludes the affect of the redundant non-active portions that does not affect the product using the circuit from the verification result, based on the analysis information and the updated analysis indication file is generated.

(c) In Step S20, the data processor 113 compares the analysis indication file previously stored in the indication file storage portion 7 and the updated analysis indication file and makes the integrated indication file. Thereafter, in Step S15, the analysis indication file and the integrate indication file are stored in the indication file storage portion 7.

(d) In Step S16, the file combining module 203 combines the pre-analysis indication file and the integrated indication file and makes the combined analysis indication file. Further, in Step S17 the data indication controller 14 instructs the display device 3 or the display devices connected to the client computers 101–104 to display the combined analysis indication file.

The computer implemented method for circuit design verification according to the third modification of the embodiment makes it possible to discriminate the affect of the activated portion with the additional verification patterns.

As an advanced example, the third modification of the embodiment is also applicable to the case where the RTL descriptions of the target LSI or the functional block inside the LSI are slightly modified. In actual LSI designing, there are many cases where the RTL descriptions of the target LSI or the functional block inside the LSI are slightly modified. To improve the efficiency of the verification and the analysis of the non-active portions, it is important to reuse the analysis information about the non-active portions where the RTL descriptions are not changed and the reason why the portion is non-active is revealed.

In this case, the RTL collector 205 collects the RTL description of the target LSI or the functional block of the LSI when the verification data collector 10 collects the verification result. The data processor 113 in FIG. 15 compares the RTL descriptions before the modification with the RTL descriptions after the modification. Concerning non-active portions located portions without modification, the data processor 113 copies the contents of the analysis indication file already stored in the indication file storage portion 7 in FIG. 15 into the pre-analysis indication file. On the contrary, concerning non-active portions located in portions with modification, the data processing unit 113 creates a post-modification pre-analysis indication file in the state prior to the analysis. Then, the data processing unit 113 stores the post-modification file in the indication file storage portion 7.

Consequently, even when some modification takes place in the RTL descriptions, it is possible to utilize the analysis results of the non-active portions obtained in the past. Therefore, it is possible to achieve an effect of improvement in the efficiency of the design verification. As a more simplified mode, the user can input module names in small-scale module units concerning the modified RTL descriptions, so that the data processing unit 113 in FIG. 15 creates the post-modification analysis indication file in a similar manner to the above-described procedures, based on that information. In the apparatus for circuit design verification 1 according to the third modification of the embodiment shown in FIG. 15, in order to correspond to the case where there are multiple pieces of simulation result data for the same LSI or the same functional block inside the LSI and registration and analysis are performed more than once, for example, a plurality of post-analysis indication files are inputted into the data processing unit 113, and the data processing unit 113 integrates the post-analysis indication files, converts the files into the integrated indication file, and then registers the integrated indication file with the indication file storage portion 7. By reviewing this integrated indication file, it is possible to easily learn a quality achievement status together with the plurality of registered post-analysis indication files.

According to the apparatus for circuit design verification 1 according to the third modification of the embodiment of the present invention, when the simulation result data concerning the same LSI or the same functional block inside the LSI are updated or when a plurality of results are registered in this concern, it is possible to integrally display the respective pieces of the functional simulation result data and the analysis processing results thereof. In this way, it is possible to allow a plurality of authorized users to review and check the contents.

FOURTH MODIFICATION OF THE EMBODIMENT

Figure 17:
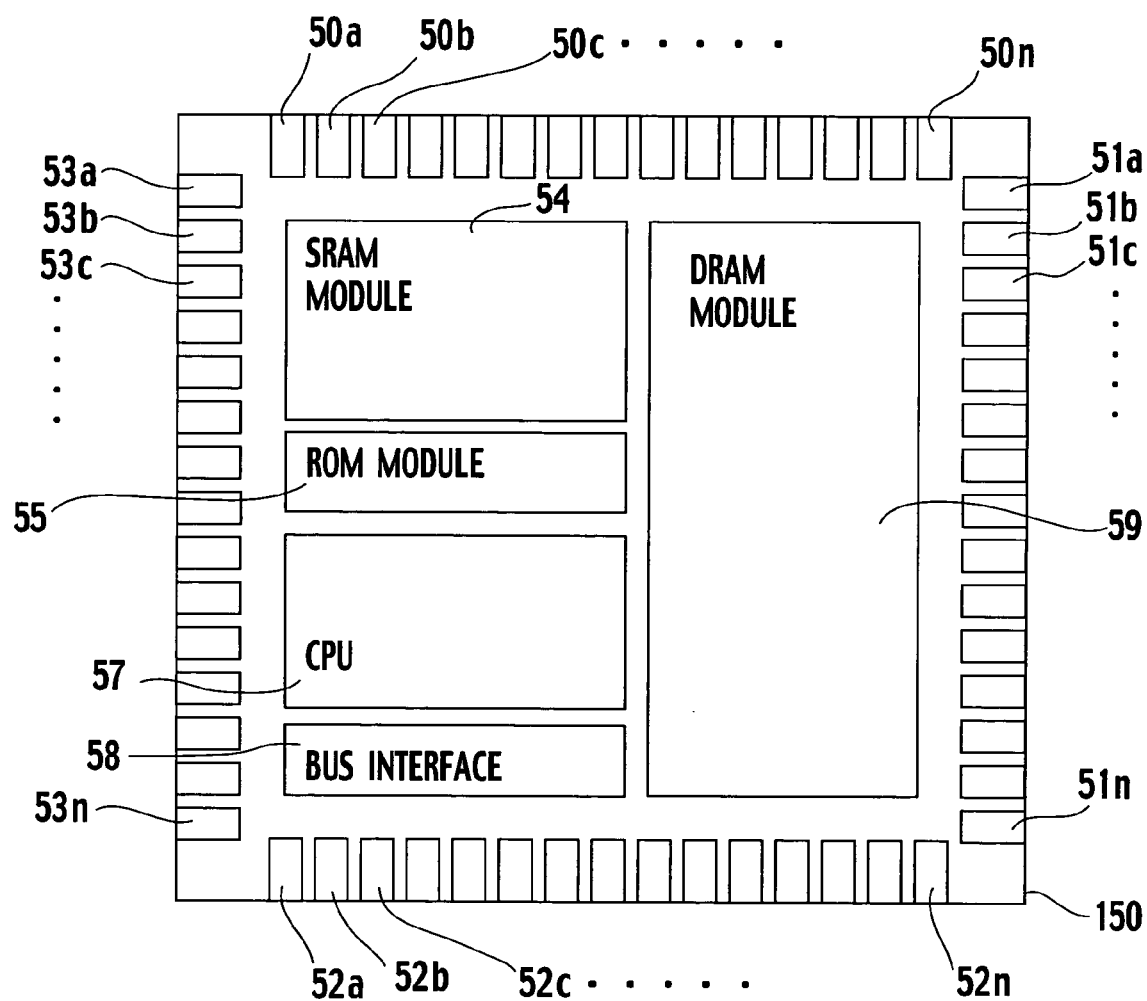
FIG. 17 is a diagram of an integrated circuit in accordance with a fourth modification of the embodiment of the present invention.

With reference to FIG. 17, an exemplary integrated circuit has a substrate 150, an SRAM module 54 embedded on the substrate 150, a DRAM module 59 embedded on the substrate 150, a read only memory (ROM) module 55 embedded on the substrate 150, a CPU 57 embedded on the substrate 150, a bus interface 58 embedded on the substrate 150 and bonding pads 50a through 50n, 51a through 51n, 52a through 52n and 53a through 53n located around the perimeter of the substrate 150.

The SRAM module 54 couples the CPU 57 to the DRAM module 59. The ROM 55 stores programs to control the CPU 57. The bus interface 58 controls a signal interface between the system-on-chip and peripherals. The bonding pads 50a–50n, 51a–51n, 52a–52n and 53a–53n are metallic films to which electrical leads may be connected.

Figure 18:
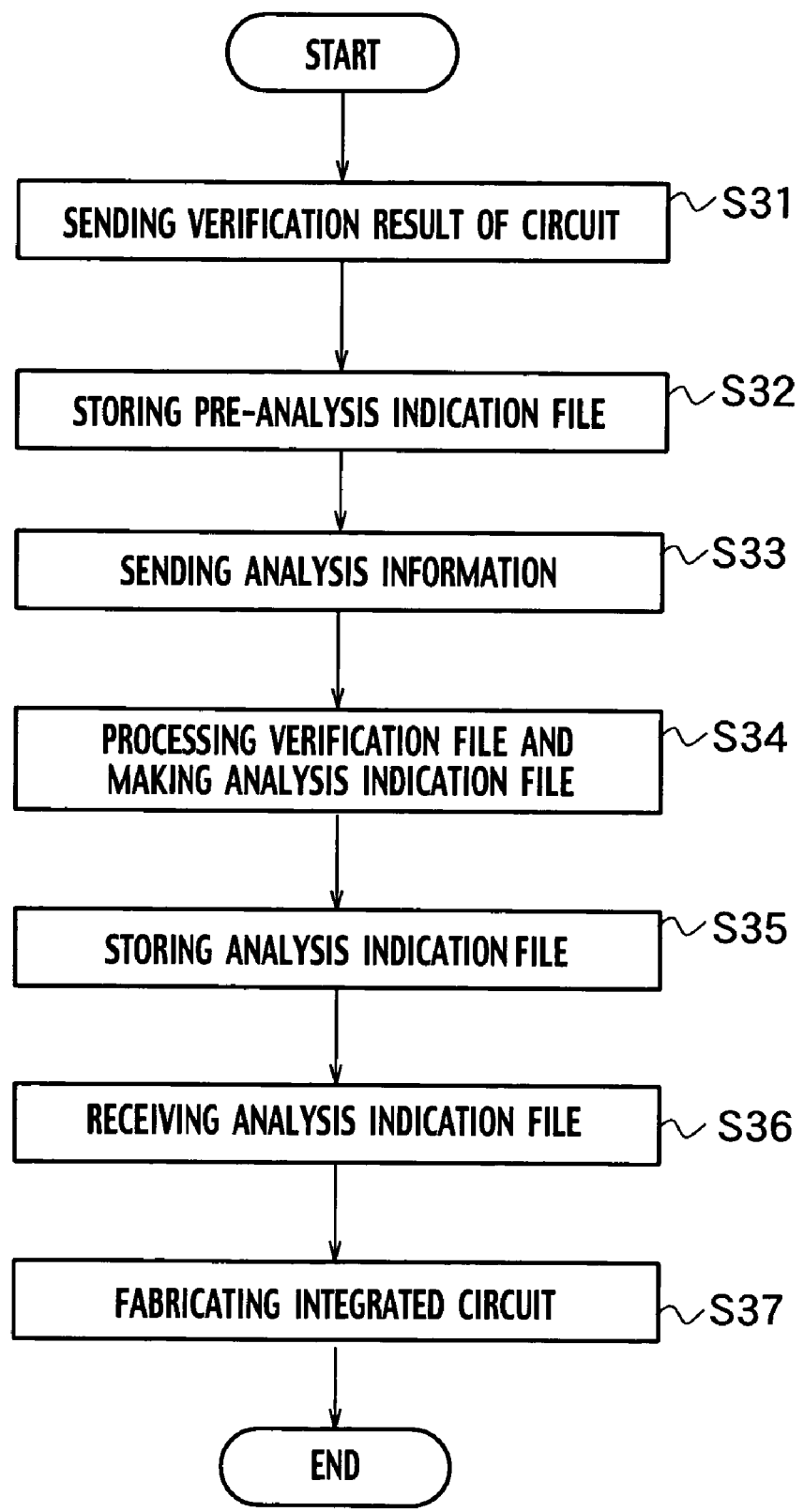
FIG. 18 is the flowchart depicting the operation of the fourth modification of the embodiment of the present invention.

With reference next to FIG. 18, method for manufacturing the integrated circuit is described.

(a) In Step S31, each of the client computers 101–104 shown in FIG. 2 sends the verification result of the circuit design to the apparatus for circuit design verification 1 through the computer network.

(b) In Step S32, each of the client computers 101–104 instructs the apparatus for circuit design verification 1 to convert the verification result to the pre-analysis indication file and store the pre-analysis indication file in the indication file storage portion 7 shown in FIG. 3.

(c) In Step S33, each of the client computers 101–104 sends analysis information about the redundant non-active portion of the circuit design to the apparatus for circuit design verification 1 through the computer network.

(d) In Step S34, each of the client computers 101–104 instructs the apparatus for circuit design verification 1 to exclude the affect of the redundant non-active portion from the verification result and make the analysis indication file.

(e) In Step S35, each of the client computers 101–104 instructs the apparatus for circuit design verification 1 to store the analysis indication file in the indication file storage portion 7.

(f) In Step S36, each of the client computers 101–104 receives the analysis indication file from the apparatus for circuit design verification 1. The step is finished when it is judged that sufficient verification has been done based on the analysis indication file.

(g) In Step S37, the integrated circuit is fabricated.

As described above, each of the client computers 101–104 can send the verification result and the analysis information. Further, each of the client computers 101–104 can receive the analysis indication file in the case that each of the client computers 101–104 is authorized to access the apparatus for circuit design verification 1. Therefore, each of the client computers 101–104 can own the analysis information of intellectual property (IP) jointly and update the analysis information by sending new updated verification result and analysis information. Therefore, it is possible to fabricate accurately the integrated circuit with short time by using the apparatus for circuit design verification 1.

(Design Verification Program)

Computer commands of a design verification program are described in detail.

The design verification program includes:

(a) collecting the verification result data, that is, functional simulation result data or result data acquired by use of dedicated software which operates with the functional simulation such as code coverage information, or fault simulation result data such as fault coverage;

(b) editing the collected verification result data to be displayed on a display device and registering a result of the editing with a indication file storage device as a pre-analysis indication file;

(c) collecting the analysis information for analyzing the verification result data;

(d) analyzing the verification result data, based on the collected analysis information;

(e) performing necessary editing processing for displaying an analysis processing result of the verification result data on the display device, and registering a result of the editing processing with the indication file storage device as the analysis indication file; and (f) displaying the pre-analysis indication file and the analysis indication file registered with the indication file storage device on the display device.

The above-described design verification program can be stored in a computer-readable recording medium. The above-described design verification system can be realized by reading this recording medium on a computer system, executing the design verification program, and thereby controlling the computer. Here, the "recording medium" is a medium capable of storing a program, such as an external memory device of a computer, semiconductor memory, a magnetic disk, an optical disk, a magnet optical disk, or a magnetic tape.

OTHER EMBODIMENTS

Although the invention has been described above by reference to the embodiment of the present invention, the present invention is not limited to the embodiment described above. Modifications and variations of the embodiment described above will occur to those skilled in the art, in the light of the above teachings.

In the embodiment, the apparatus connectable to the computer network for circuit design verification is used to obtain the invaluable code coverage information and fault coverage information. However, the apparatus connectable to the computer network for circuit design verification is useful for other verification results. For example, in static timing analysis to verify whether the LSI works correct or not by desirable clock frequency, the apparatus for circuit design verification shown in FIG. 3 is useful to exclude the redundant non-active path from total critical path.

As described above, the present invention includes many variations of embodiments. Therefore, the scope of the invention is defined with reference to the following claims.

What is claimed is:

1. An apparatus connectable to a computer network for circuit design verification comprising:
   a verification result collector configured to collect a verification result of a circuit;
   a data conversion and registration module configured to convert the verification result to a pre-analysis indication file;
   an analysis information collector configured to collect analysis information about a redundant non-active portion of the circuit;
   an analysis information processor configured to exclude an affect of the redundant non-active portion from the verification result and make a analysis indication file;
   an indication file storage portion configured to store the pre-analysis indication file and the analysis indication file; and
   a data indication controller configured to output the pre-analysis indication file and the analysis indication file.

2. The apparatus of claim 1, further comprising a file combining module configured to combine the pre-analysis indication file and the analysis indication file.

3. The apparatus of claim 1, further comprising:
   a criterion data collector configured to collect a quality standard of the circuit; and
   a criterion data storage portion configured to store the quality standard.

4. The apparatus of claim 1, wherein the data indication controller further comprises a data discriminator configured to extract an item failing the quality standard from the analysis indication file.

5. The apparatus of claim 1, further comprising a data processor configured to extract information of a common non-active portion from the pre-analysis indication file and the verification result.

6. The apparatus of claim 1, wherein the verification result is at least one of an RTL code coverage and a fault detecting ratio.

7. A computer implemented method for design verification comprising:
   collecting a verification result of a circuit through a computer network;
   converting the verification result to a pre-analysis indication file and storing the pre-analysis indication file in an indication file storage portion;
   collecting analysis information about a redundant non-active portion of the circuit through the computer network;
   excluding an affect of the redundant non-active portion from the verification result and making an analysis indication file; and
   storing the analysis indication file in the indication file storage portion.

8. The method of claim 7, further comprising instructing a display device to show the pre-analysis indication file and the analysis indication file.

9. The method of claim 7, further comprising combining the pre-analysis indication file and the analysis indication file.

10. The method of claim 7, further comprising extracting information of a common non-active portion from the pre-analysis indication file and the verification result.

11. The method of claim 7, wherein the verification result is at least one of an RTL code coverage and a fault detecting ratio.

12. A computer program product comprising a computer readable medium for controlling a computer system so as to verify circuit designs, the computer program product comprising:
   instructions configured to collect a verification result of a circuit through a computer network;
   instructions configured to collect analysis information about a redundant non-active portion of the circuit through the computer network;

instructions configured to exclude an affect of the redundant non-active portion from the verification result and making an analysis indication file within the computer system; and instructions configured to store the analysis indication file in the indication file storage portion within the computer system.

13. The computer program product of claim 12, further comprising instructions configured to show the pre-analysis indication file and the analysis indication file by a display device.

14. The computer program product of claim 12, further comprising instructions configured to combine the pre-analysis indication file and the analysis indication file within the computer system.

15. The computer program product of claim 12, further comprising instructions configured to extract information of a common non-active portion from the pre-analysis indication file and the verification result.

16. The computer program product of claim 12, wherein the verification result is at least one of an RTL code coverage and a fault detecting ratio.

17. A computer implemented method for manufacturing an integrated circuit comprising:

sending a verification result of a circuit design to an apparatus for circuit design verification through a computer network;

instructing the apparatus to convert the verification result to a pre-analysis indication file and store the pre-analysis indication file in an indication file storage portion;

sending analysis information about a redundant non-active portion of the circuit design to the apparatus through the computer network;

instructing the apparatus to exclude an affect of the redundant non-active portion from the verification result and make an analysis indication file;

instructing the apparatus to store the analysis indication file in the indication file storage portion;

receiving the analysis indication file from the apparatus; and fabricating the integrated circuit.

18. An integrated circuit, fabricated using method comprising:

sending a verification result of a circuit design to an apparatus for circuit design verification through a computer network;

instructing the apparatus to convert the verification result to a pre-analysis indication file and store the pre-analysis indication file in an indication file storage portion;

sending analysis information about a redundant non-active portion of the circuit design to the apparatus through the computer network;

instructing the apparatus to exclude an affect of the redundant non-active portion from the verification result and make an analysis indication file;

instructing the apparatus to store the analysis indication file in the indication file storage portion;

receiving the analysis indication file from the apparatus; and fabricating the integrated circuit.

* * * * *